(12) United States Patent
Auburger et al.

(10) Patent No.: US 7,476,036 B2
(45) Date of Patent: Jan. 13, 2009

(54) OPTOCOUPLER FOR CONVERTING OPTICAL SIGNALS INTO ELECTRICAL SIGNALS AND VICE VERSA

(75) Inventors: Albert Auburger, Regenstauf (DE); Jochen Dangelmaier, Beratzhausen (DE); Cyrus Ghahremani, Regensburg (DE); Thomas Lichtenegger, Alteglofsheim (DE); Stefan Paulus, Zeitlarn (DE); Jean Schmitt, Zeitlarn (DE); Horst Theuss, Wenzenbach (DE); Helmut Wietschorke, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/679,601

(22) Filed: Feb. 27, 2007

(65) Prior Publication Data

US 2007/0217734 A1    Sep. 20, 2007

(30) Foreign Application Priority Data

Mar. 17, 2006    (DE) .................. 10 2006 012 780

(51) Int. Cl.
*G02B 6/42* (2006.01)
(52) U.S. Cl. ................................ 385/88; 385/92
(58) Field of Classification Search .................. None
See application file for complete search history.

(56) References Cited

U.S. PATENT DOCUMENTS

| | | | | |
|---|---|---|---|---|
| 5,337,396 | A | * | 8/1994 | Chen et al. ............ 385/92 |
| 5,482,658 | A | * | 1/1996 | Lebby et al. ............ 264/1.24 |
| 6,483,960 | B2 | | 11/2002 | Schroedinger |
| 6,517,258 | B1 | | 2/2003 | Keska et al. |
| 7,048,450 | B2 | | 5/2006 | Beer et al. |
| 7,049,704 | B2 | * | 5/2006 | Chakravorty et al. ....... 257/778 |
| 7,101,092 | B2 | | 9/2006 | Beer et al. |
| 2004/0247256 | A1 | * | 12/2004 | Hurt et al. ............ 385/88 |

FOREIGN PATENT DOCUMENTS

JP    2006054259 A    2/2006

OTHER PUBLICATIONS

Machine translation of JP 2006-54259 A from http://www4.ipdl.inpit.go.jp/Tokujitu/tjsogodben.ipdl?N0000=115.*
Most Optical POF Transmitter and Receiver, published by Infineon Technologies AG, Munich, Germany, Sep. 2003.
V23814-K1306-M230 Parallel Optical Link: Paroli Tx DC/MUX-ENC-V23815-K1306-M230 Parallel Optical Link: Paroli Rx DC/DEMUX-DEC, published by Infineon Technologies AG, Munich, Germany, May 2000.

* cited by examiner

*Primary Examiner*—Sung H Pak
*Assistant Examiner*—Mike Stahl
(74) *Attorney, Agent, or Firm*—Edell, Shapiro & Finnan, LLC

(57) ABSTRACT

An optocoupler, for converting optical signals into electrical signals and vice versa, includes a package with a jack connector for receiving an optical waveguide. On a lower side of the package, surface-mountable outer contacts are arranged on an interconnection film. A mounting position for semiconductor chips, including one optical semiconductor chip and one application-specific semiconductor chip, is provided in the package on the optical axis of the optical waveguide. The optical semiconductor chip is aligned with the optical axis inside the package. The outer contacts are arranged outside the package on the flexible interconnection film. Between the mounting position and the outer contacts, the interconnection film includes a curved region which is embedded in the package material such that the surface-mountable outer contacts on the lower side of the package are freely accessible.

18 Claims, 5 Drawing Sheets

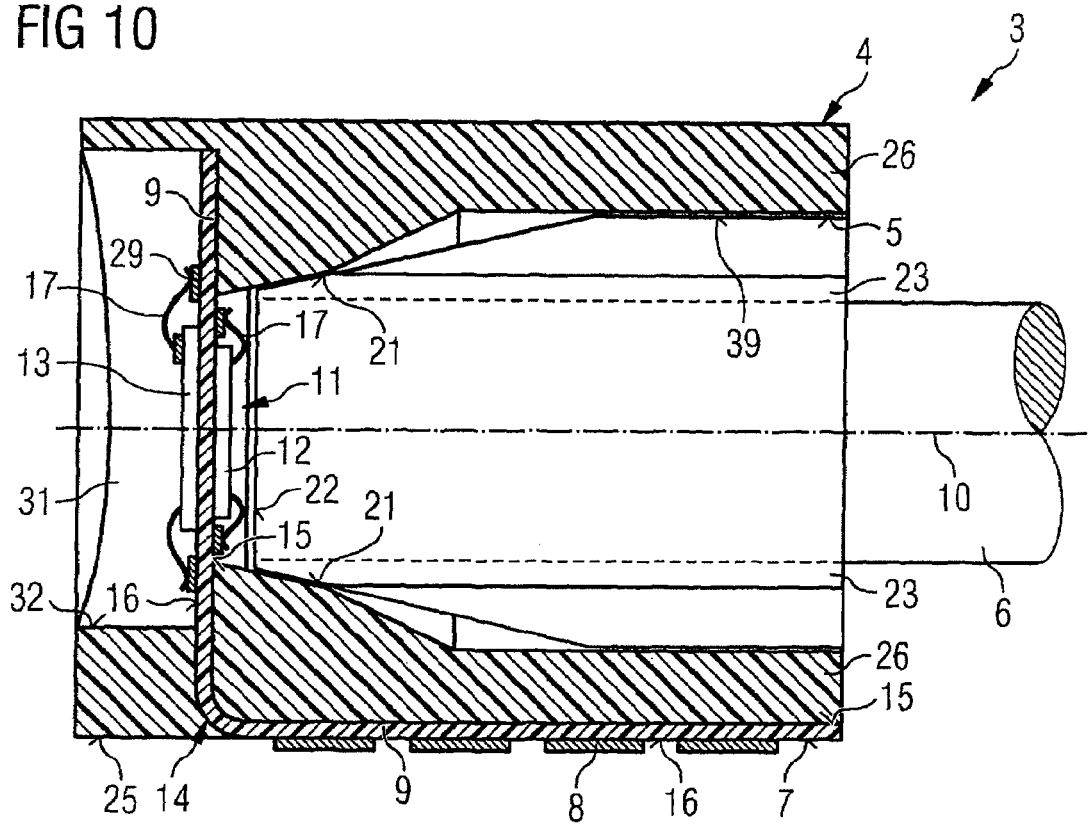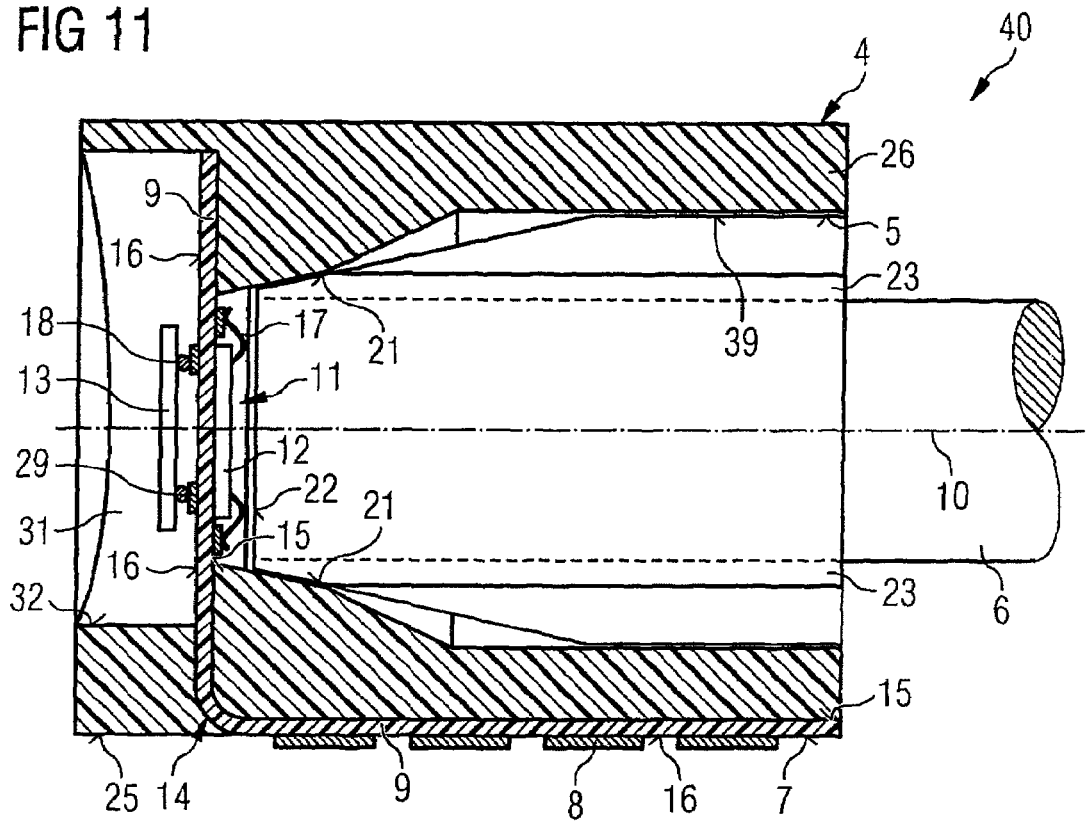

US 7,476,036 B2

OPTOCOUPLER FOR CONVERTING OPTICAL SIGNALS INTO ELECTRICAL SIGNALS AND VICE VERSA

CROSS REFERENCE TO RELATED APPLICATIONS

This application claims priority under 35 U.S.C. §119 to Application No. DE 102006012780.3 filed on Mar. 17, 2006, entitled "Optocoupler for Converting Optical Signals into Electrical Signals and Vice Versa," the entire contents of which are hereby incorporated by reference.

BACKGROUND

Optocouplers convert optical signals into electrical signals and vice versa. Optocoupler arrangements have been proposed which include an optoelectronic module that comprises a circuit carrier, which can be divided into a first region and a second region, the first and second regions being connected together via a flexible interconnection film. Such an optocoupler has the disadvantage that the two regions of the circuit carrier need to be bent at an angle to one another via the flexible interconnection film and are to be mutually aligned and fixed in this angled-off state, which represents a problem due to the unsupported flexible interconnection film particularly because the bent or angled-off region is freely accessible and therefore exposed to an increased risk of damage.

Another optomodule comprises a carrier substrate, wiring means, contact means and an optosemiconductor for transmitting and receiving light. To this end the optomodule comprises a circuit board section, which carries the optosemiconductor and is connected to a module circuit board via a flexiconductor section, a plurality of external components being mounted on the module circuit board. This structure of an optocoupler or optomodule also has the disadvantage that the flexible circuit board section, which connects the circuit board with the optosemiconductor and the module circuit board with a plurality of external components, is exposed, with virtually no protection to risks of damage. The known optoelectronic modules furthermore have the disadvantage that they cannot be arbitrarily minimized, so that further miniaturization is not available for such optocouplers.

Optically based data transmission over short transmission distances from circuit board to circuit board is thus carried out according to the known devices either by means of POF (plastic optical fiber) for smaller data rates or via parallel transmission for high data rates. Owing to their size, however, the designs employed are unsuitable for use in spatially limited applications, for example in mobile telephones or digital cameras. There are therefore not yet any optical data transmission solutions for products with very space-critical design. Existing optical solutions frequently comprise expensive and complicated free beam optics, for example with deviating prisms and other optical components, which entail a large space requirement. Such free beam optics are not usable for cost effective applications in products with a spatial installation limitation, such as in mobile telephones or digital cameras.

Currently, microcoaxial lines with electrical jacks are often used in order to establish a connection between two circuit boards. Individual coaxial lines are often to be mounted manually in this case, which is cost intensive and onerous. Owing to the size of these individual coaxial lines, a common jack with parallel lines cannot be mounted until after the coaxial line has been fed through a hinge-like adaptor between the circuit boards. Yet since the space available for such assembly in space-critical applications is extremely small, the number of connections is limited, and the data rate for transmission via coaxial cable is also extremely small.

SUMMARY

An optocoupler, for converting optical signals into electrical signals and vice versa, includes a package with a jack connector for receiving an optical waveguide. On an outer lower side of the package, surface-mountable outer contacts are arranged on an interconnection film. A mounting position for semiconductor chips, including one optical semiconductor chip and one application-specific semiconductor chip with an integrated circuit, is provided in the package on the optical axis of the optical waveguide. The optical semiconductor chip is aligned with the optical axis inside the package. The outer contacts are arranged outside the package on the flexible interconnection film. Between the mounting position and the outer contacts, the interconnection film includes a curved region which is embedded in the package material such that the surface-mountable outer contacts on the lower side of the package are freely accessible.

The above and still further features and advantages of the described optocoupler will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The described optocoupler is explained in more detail below with reference to exemplary embodiments, where:

FIG. 1 shows a schematic cross section along a vertical section plane through an optocoupler of the first embodiment;

FIG. 2 shows a schematic cross section along a horizontal section plane through an optocoupler according to FIG. 1;

FIG. 3 shows a schematic bottom view of the optocoupler according to FIG. 1;

FIG. 4 shows a schematic cross section through a package for an optocoupler of the second embodiment of the invention;

FIG. 5 shows a schematic cross section through the package according to FIG. 4 after a semiconductor chip stack has been installed;

FIG. 6 shows a schematic cross section through the package according to FIG. 5 after the semiconductor chip stack has been covered with a covering compound;

FIG. 7 shows a schematic cross section through a first mounting arrangement of the semiconductor chip in the mounting position;

FIG. 8 shows a schematic cross section through a second mounting arrangement of the semiconductor chip in the mounting position;

FIG. 9 shows a schematic cross section through a third mounting arrangement of the semiconductor chip in the mounting position;

FIG. 10 shows a schematic cross section along a vertical section plane through an optocoupler of a third embodiment; and FIG. 11 shows a schematic cross section along a vertical section plane through an optocoupler according to a fourth embodiment.

DETAILED DESCRIPTION

Figure 1:
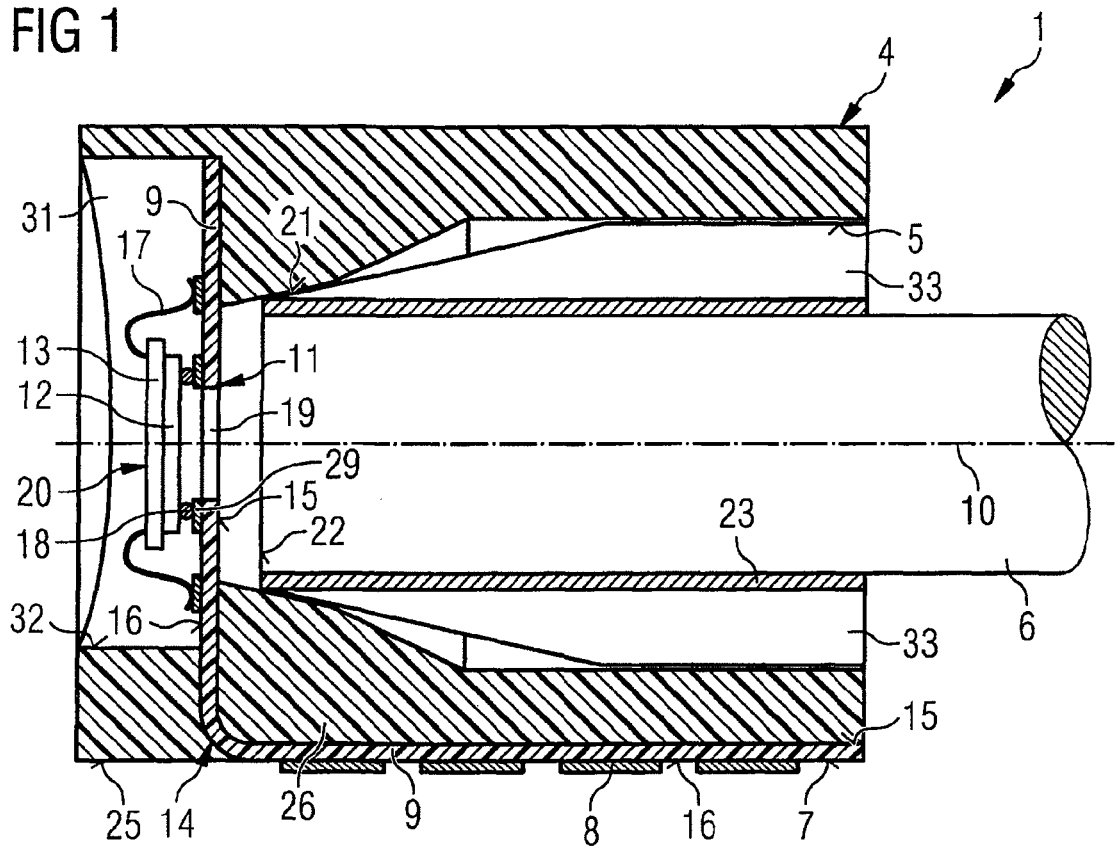
FIGS. 1 to 3 show schematic views of an optocoupler according to a first embodiment.

An optocoupler is described herein for converting optical signals into electrical signals and vice versa. The optocoupler is compact and reliable, such that it allows the extraction of optical signals from an optical waveguide and the input of optical signals into an optical waveguide over the smallest of spaces and at the same time converts such optical signals into electrical signals and, via corresponding outer contacts of the optocoupler, can send and receive the electrical signals to and from a superordinate circuit board.

The optocoupler comprises a package with a jack connector for an optical waveguide. Arranged in the package is a mounting position for two semiconductor chips, comprising one optical semiconductor chip and one application-specific semiconductor chip with an integrated circuit. The optical semiconductor chip is aligned with the optical axis. The semiconductor chips are arranged inside the package and the outer contacts are arranged outside the package on a flexible interconnection film. Between the mounting position and the outer contacts, the interconnection film comprises a curved region which is embedded in the package material so that only the surface-mountable outer contacts on the lower side of the package are freely accessible.

Such an optocoupler has the advantage that it can transmit, send and/or receive and evaluate a multiplicity of pulse code-modulated signals via the jack connector for the optical waveguide, and can transmit them onto a superordinate circuit board with the aid of the surface-mountable contacts. The optocoupler furthermore has the advantage that it comprises a compact package, which can furthermore be miniaturized arbitrarily since merely the size of the optoelectronic semiconductor chip and the diameter of the waveguide limit further miniaturization. In other words, since the size of the package is limited by the diameter of the waveguide and the size of the optoelectronic semiconductor chip, the package can be further miniaturized according to further miniturizations of the waveguide diameter and the size of the optoelectronic chip. A high packing density is therefore achieved with the optocoupler according to the described device, and optical connection is made possible on the smallest of areas.

The fact that the flexible film comprises an "interface" for both the optical and the electrical connection obviates complicated and sensitive deviating optics, which are often used in known optocouplers. Furthermore, the surface-mountable outer contacts provide the opportunity to mount the optocoupler, via a soldering method, such that space is saved on corresponding superordinate circuit boards. In which case, it is possible to obviate pre-mounted jacks which would demand a corresponding volume. The assembly outlay for the described optocoupler is thus reduced to a minimum.

In an embodiment of the described optocoupler, in the region of the optical axis, the optical semiconductor chip is mounted in the direction of the optical waveguide on an upper side of the flexible interconnection film and the semiconductor chip with an integrated circuit is mounted on an opposite lower side of the flexible interconnection film. This arrangement of the semiconductor chips in the form of a stack, with the interconnection film arranged in between, provides a compact optoelectronic structure inside the package, and has the advantage that the space requirement for this stack is extremely small so that the enclosing package can be minimized. The two semiconductor chips may be electrically connected to the interconnection film via bonding wires.

On the other hand, it is possible for at least one semiconductor chip to comprise flipchip contacts. The at least one semiconductor chip is electrically connected to the interconnection film via the flipchip contacts. In another embodiment of the described optocoupler, the interconnection film comprises an access opening in the region of the optical axis of the package, behind which a semiconductor chip stack comprising both semiconductor chips is mounted, the optical semiconductor chip being arranged immediately behind the opening and the application-specific semiconductor chip with its evaluation circuit being arranged subsequently in the optical beam path.

Such a semiconductor chip stack may comprise flipchip contacts, by which it is fixed on the interconnection film in the edge region of the access opening. This arrangement consequently ensures that, in the beam path inside the package, the semiconductor chips remain arranged successively in the optical beam path and in a compact space-saving arrangement. On the other hand, centered coupling of the optical waveguide is ensured by a jack connector, a conical sleeve receptor being provided in the package, which is adapted to receive a connection sleeve enclosing the end of the optical waveguide and providing the optical waveguide with an accurate fit.

The connection sleeve may be shrink-fitted onto the optical waveguide, a conical end of the connection sleeve cooperating with the conical sleeve receptor. Furthermore, the package may comprise latching hooks which can be engaged with the connection sleeve such that the latching hooks automatically latch after the connection sleeve is inserted into the conical sleeve receptor and fix the optical waveguide in the jack connector.

In another embodiment of the described optocoupler, the package further comprises a plastic package compound in which the flexible interconnection film and the jack connector are encapsulated such that the outer contacts, on the lower side of the film which also constitute the lower side of the package, remaining freely accessible.

Mobile telephones, digital cameras or camcorders comprise such a compact optocoupler as described herein, so that it is possible to ensure that the signal and image processing inside a mobile telephone can be further accelerated. When producing a package injection molded from plastic, on the one hand the flexible interconnection film may be integrated in the package and the optical jack connector may also be formed with latching hooks on one side and an open cavity on the opposite side, such that the open cavity can be used to gain access to the mounting position of the flexible film so that, in the open cavity, the optical semiconductor chip can be contacted or mounted on the interconnection film with the aid of a flipchip method and so that the application-specific semiconductor chip can be contacted or mounted via conventional adhesive bonding and wiring of the interconnection film.

The optical chip can be aligned with the optical axis through an opening in the semiconductor film in the direction of the jack connector. When it emerges from the package, the flexible interconnection film may be bent through 90 degrees and in this way it is possible to produce the wiring, the readout of the terminals on a circuit board plane. The open cavity, via which the semiconductor chips are mounted on the interconnection film in the mounting position, may be filled with a so-called "globe top material" and the semiconductor chips can thus be protected against environmental effects. Owing to the conical design of the jack connector in the package, the end of the optical waveguide can be form-fitted into the conical jack connector with a correspondingly adapted connection sleeve and centered in the optical axis while being self-aligned with the optical chip on the flexible semiconductor film. Meanwhile, the latching hooks of the jack connector ensure that the optical waveguide cannot be loosened and always lies in the centered position.

In another alternative embodiment of the package, it is provided with an injection molding compound which contains conductive particles, for example graphite. The package together with the interconnection film can thus permit electromagnetic shielding, to which end the interconnection film or selected interconnections of the film may be set to ground potential, so as to ground the package and the entire outer geometry. The interconnections may also particularly advantageously be arranged inside the flexible interconnection film, and the interconnection film may be externally coated with the grounded metal layer. Such a package variant thus forms a Faraday cage which shields the emission and ingress of electromagnetic waves. In the case of EMC-sensitive products, external shielding can thus be fully obviated.

Advantages are offered by flipchip mounting of the optical chip, on the rear side of which the application-specific integrated circuit is adhesively bonded, together with the shielded package variant. The smallest of designs can be achieved in this way, since no wire contacting process is used for the optical chip and this saves on space for the wire routing and the contact surfaces required for this on the interconnection film. A further advantage is that the chips are mountable from one side in this variant, thereby obviating an additional covering for the optical chip. Particularly for high data rates, the shielded variant of the plastic package with inlaid electrically conductive particles is advantageous since it saves on shielding at the customer end.

In the following paragraphs, exemplary embodiments of the optocoupler are described in connection with the figures.

FIG. 1 shows a schematic cross section along a vertical section plane through an optocoupler 1 of a first embodiment. To this end, the optocoupler 1 comprises a plastic package 4, which includes a jack connector 5 for an optical waveguide 6. This jack connector 5 comprises a conical sleeve receptor 21 into which one end 22 of the optical waveguide 6, which is enclosed by a connection sleeve 23, fits in a self-aligning fashion. The connection sleeve 23 likewise comprises a conical tip towards the end 22 of the optical waveguide 6, and merges into a cylindrical part which can be fitted accurately into the jack connector 5 in a self-aligning fashion. The connection sleeve 23 is either adhesively bonded or shrink-fitted onto the end 22 of the optical waveguide 6.

After the end 22 of the optical waveguide 6 with the connection sleeve 23 has been inserted into the jack connector 5, the optical axis 10 is aligned with a semiconductor chip stack 20, which is arranged in a mounting position 11 on a flexible interconnection film 9 encapsulated in the package 4. In this embodiment, the interconnection film 9 comprises an access opening 19 in the mounting position 11, through which optical signals can act on the optical semiconductor chip 12 or, conversely, be emitted from the semiconductor chip 12. In electrical terms, the optical semiconductor chip 12 is connected to the interconnection film 9 via flipchip contacts 18 and contact terminal surfaces 29, with interconnections leading from the contact terminal surfaces 29 to the surface-mountable outer contact 8 on the lower side 25 of the package 4 to one of the outer sides 7 of the package 4.

An application-specific semiconductor chip 13, which comprises an integrated circuit, is adhesively bonded via its rear side on the optical semiconductor chip 12, while connections to contact surfaces 29 on the interconnection film 9 can be established on the active upper side of the application-specific semiconductor chip 13 via bonding wires 17. These contact surfaces 29 are also connected to outer contacts 8 on the lower side 25 of the package 4 via interconnections of the flexible interconnection film 9. These outer contacts 8 are surface-mountable, the flexible interconnection film 9 comprising a curvature 14 which is fully embedded in the plastic package compound 26 of the package 4, between the mounting position 11 and the outer contacts 8 on the lower side 25 of the package 4. This achieves high stability, the plastic package compound 26 also protecting the interconnection film 9 with the curvature 14 against damage. In order to protect against environmental effects, the semiconductor chip stack is embedded in a covering compound 31, which is made of a so-called "globe top material". This covering compound 31 fills a cavity 32 in the package 4, which is intended for the mounting position 11 of the semiconductor interconnection film 9 with the semiconductor chip stack 20.

Figure 2:
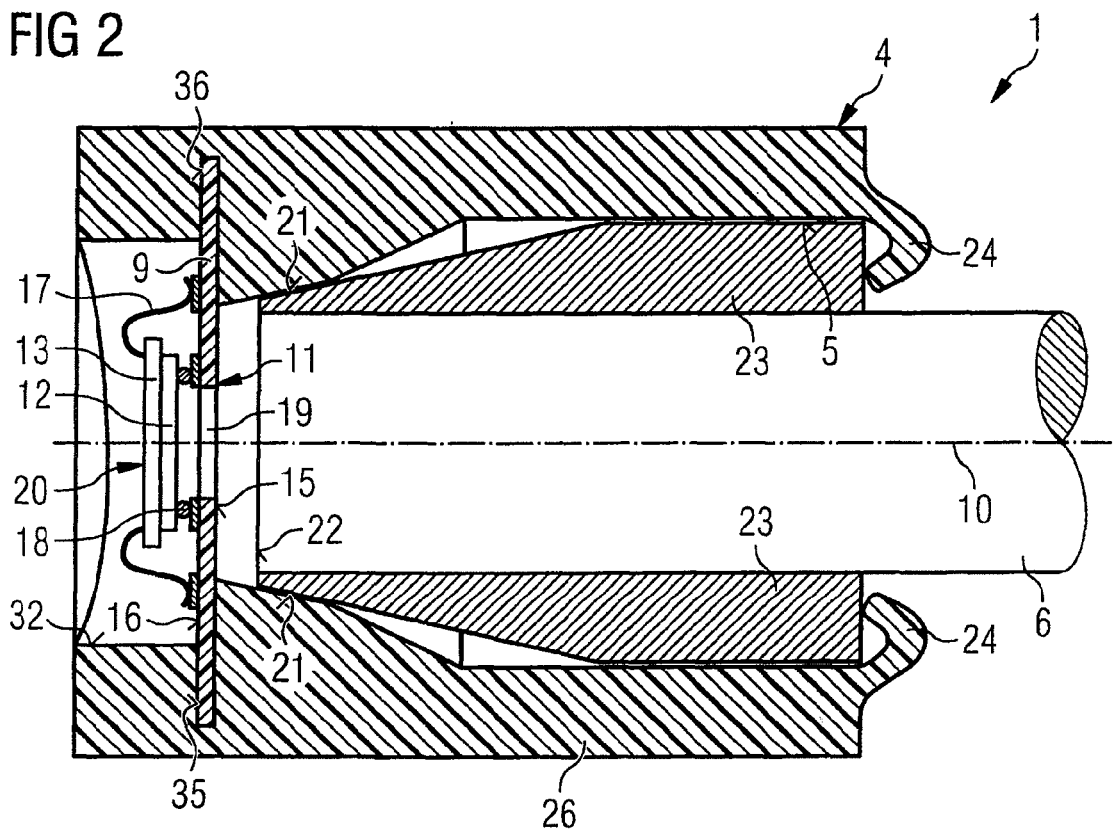

FIG. 2 shows a schematic cross section along a horizontal section plane through an optocoupler 1 according to FIG. 1, components with the same functions as in FIG. 1 being denoted by the same references and not explained again. This horizontal section plane shows latching hooks 24, by which anchoring and self alignment of the optical waveguide 6 is achieved when the connection sleeve 23 is inserted with the end 22 of the optical waveguide 6. To this end the recesses 33 of the connection sleeve 23, which are shown in FIG. 1, are first moved up to the latching hooks 24 and then the connection sleeve is anchored on the latching hooks 24 by rotating the optical waveguide 6 with the connection sleeve 23, similarly as a bayonet connection. It can furthermore be seen that the interconnection film 9 is fixed in its alignment at its edge regions 35 and 36 by the plastic package compound 26 of the package 4, so that a stable setting of the mounting position 11 is guaranteed.

Figure 3:
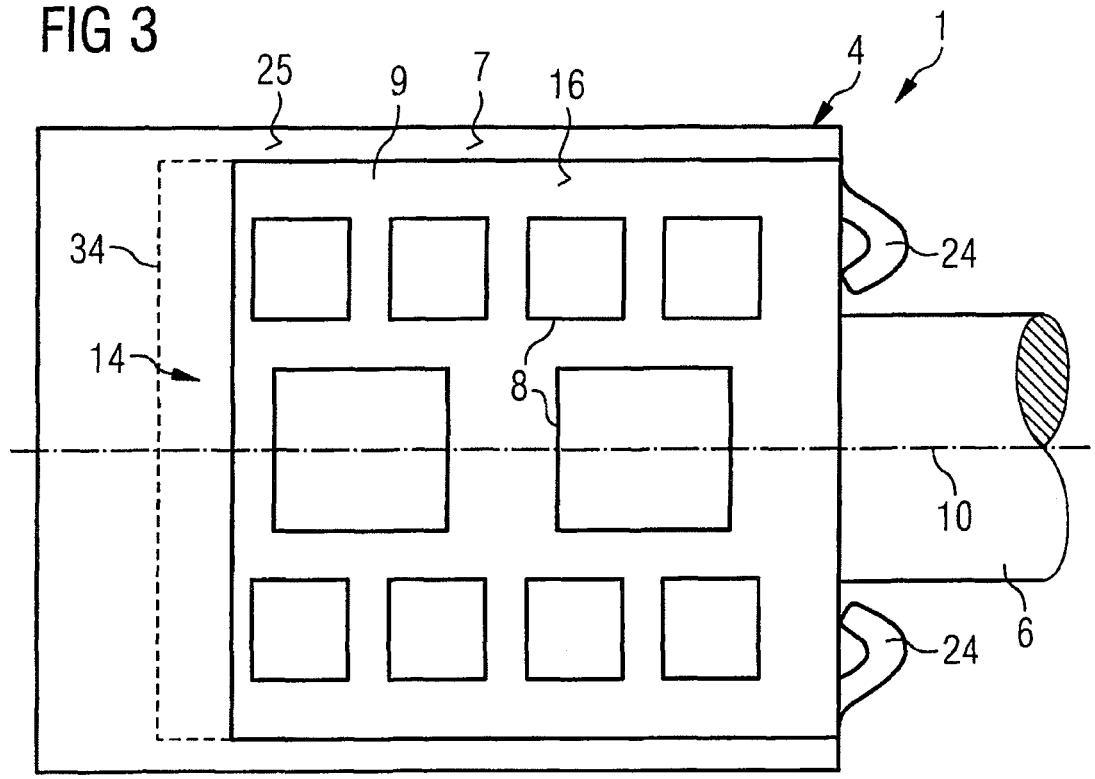

FIG. 3 shows a schematic bottom view of the optocoupler 1 according to FIG. 1. The bottom view shows the arrangement of the various outer contacts 8, one of the outer contacts 8 being at ground potential. At the same time, the dashed line 34 in the bottom view shows the region of the curvature 14, which the flexible film 9 comprises between the outer contacts 8 and the mounting position inside the package. Merely the optical waveguide 6 centered on the optical axis 10, which is denoted by a dot and dash line, protrudes from the package 4.

Figure 4:
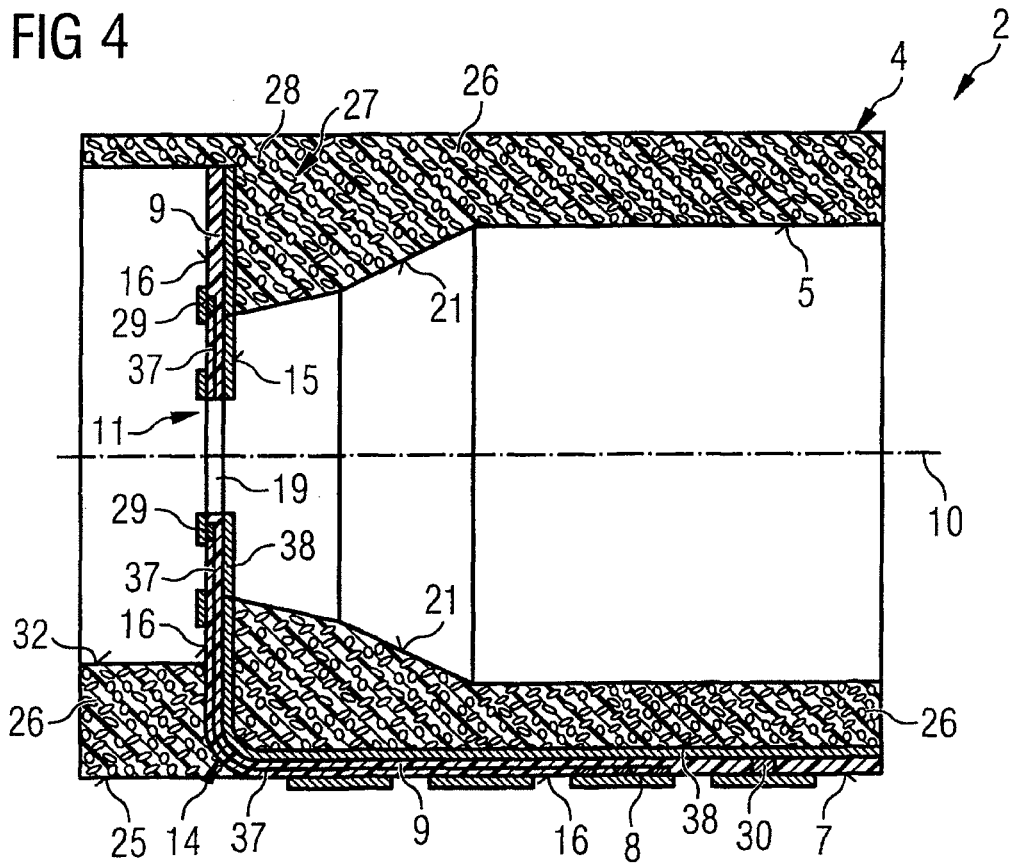
FIGS. 4 to 6 show schematic cross sections along a vertical section plane through a package when assembling an optocoupler of a second embodiment.
Figure 5:
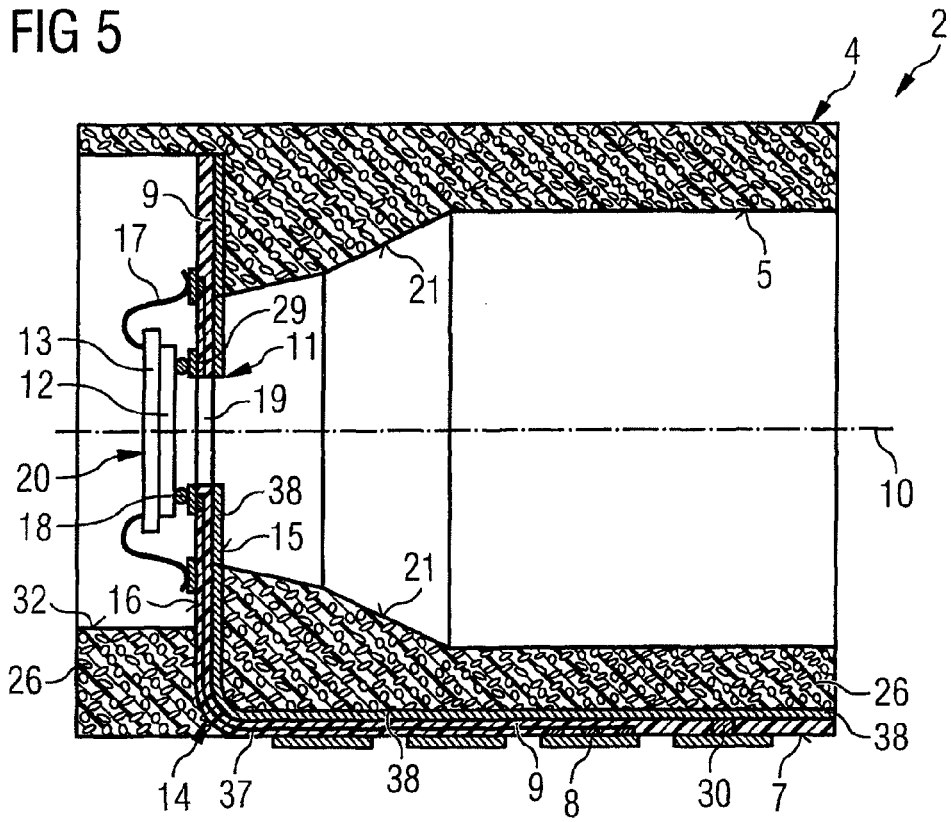
Figure 6:
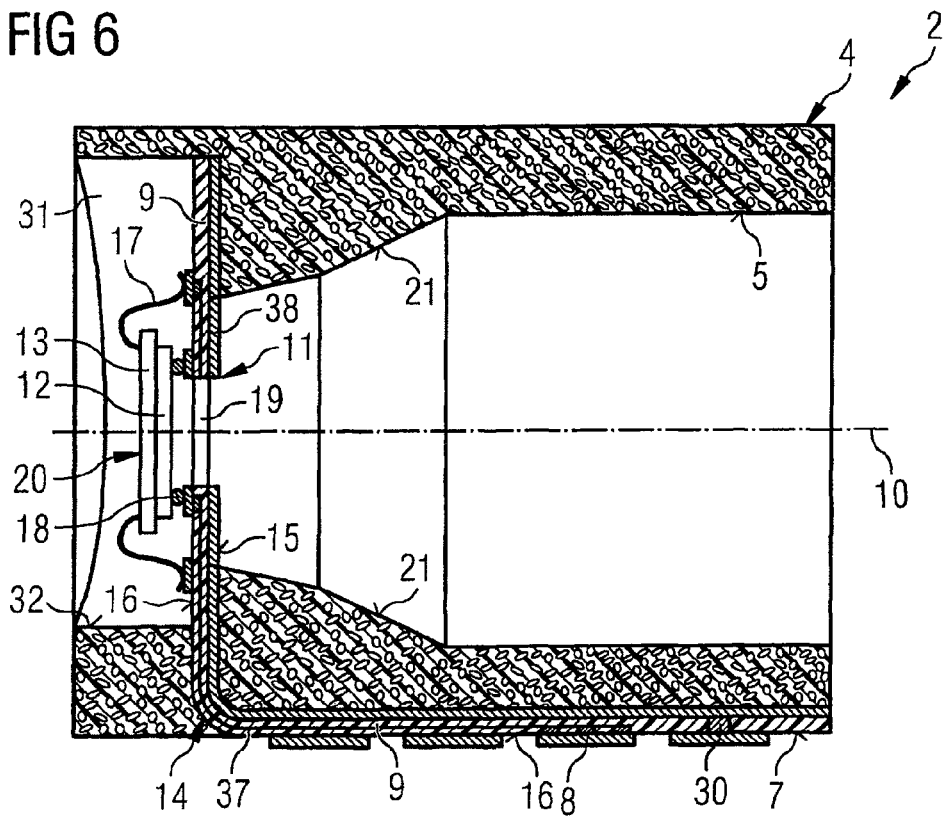

FIGS. 4 to 6 show schematic cross sections along a vertical section plane through a package 4 for an optocoupler 2 of a second embodiment. In this embodiment, the interconnection film 9 comprises interconnections 37 which are arranged inside the interconnection film 9 and connect contact terminal surfaces 29 in the mounting position 11 to outer contacts 8 on the outer side 7 of the package 4. The upper side 15 of the interconnection film 9, which is arranged facing the plastic package compound 26, is furthermore masked by a continuous metal layer 38 which is electrically connected to an outer contact 8 on the lower side 25 of the package 4 through a via contact 30, so that a ground potential can be applied to the metal layer 38 through this outer contact 8 and the via contact 30. The plastic package compound 26 is also filled with a filler material 27 which comprises electrically conductive particles 28, so that the package 4 also constitutes shielding which is set to ground potential via the metal layer 38 and thus shields the cavities of the package 4 against interfering electromagnetic fields.

FIG. 5 shows a schematic cross section through the package 4 according to FIG. 4 after a semiconductor chip stack 20 has been installed in the mounting position 11, the optical semiconductor chip 12 here first being fixed on contact terminal surfaces 29 of the interconnection film 9 with the aid of flipchip contacts 18, after which the application-specific semiconductor chip 13 is adhesively bonded onto the rear side of the optical semiconductor chip 12 and electrically connected via bonding wires 17, likewise to corresponding contact terminal surfaces 29 of the interconnection film 9. As already mentioned with respect to FIG. 4, the interconnections 37 in this case lie inside the film material of the interconnection film 9 and lead from the contact terminal surfaces 29 to outer contacts 8, one of the outer contacts 8 on the lower side 16 of the interconnection film 9 being at ground potential and the continuous metal layer 38 on the upper side 15 of the interconnection film 9 being set to ground potential through a via contact 30.

FIG. 6 shows a schematic cross section through the package 4 according to FIG. 5 after the semiconductor chip stack 20 has been covered with a covering compound 31, which has been discussed above. When the semiconductor chip stack 20 is being mounted, care is taken for the optically sensitive surface, or that surface of the optical semiconductor chip 12 which emits optical signals, to be aligned exactly with the optical axis 10 which is denoted in the figure by a dot and dash line.

Figure 7:
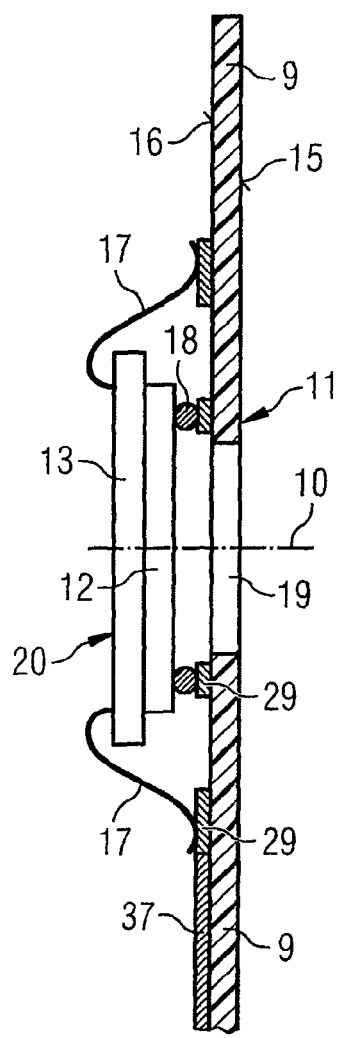
FIGS. 7 to 9 show variants of the mounting arrangement of semiconductor chips in a mounting position of the flexible interconnection film inside the package.
Figure 8:
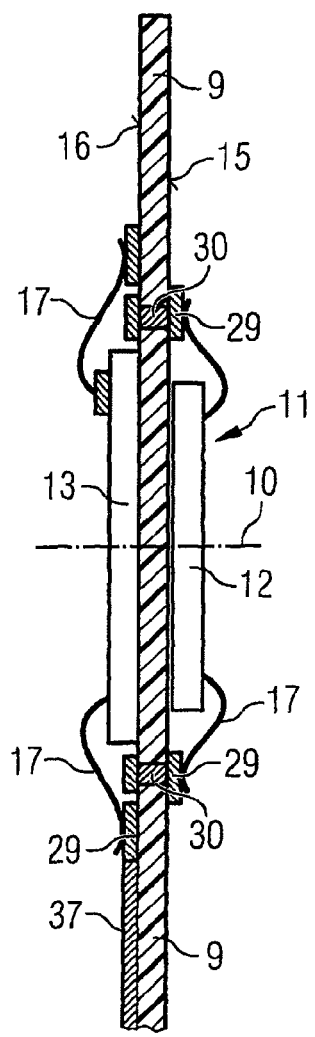
Figure 9:
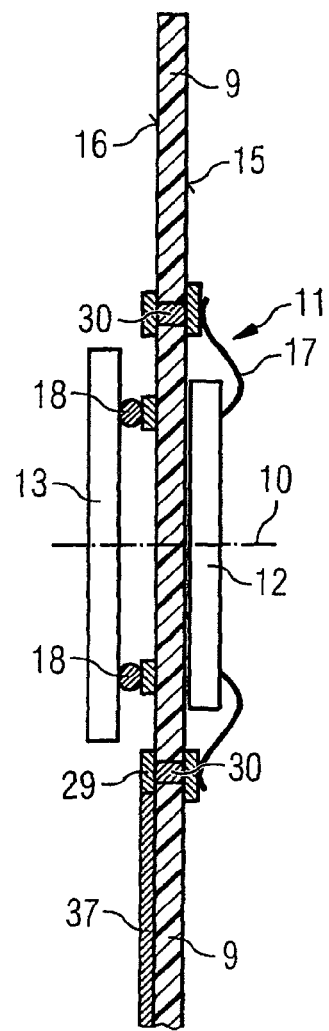

FIGS. 7 to 9 show variants of the mounting arrangement of semiconductor chips 12 and 13 in a mounting position 11 of the flexible interconnection film 9 inside the package 4.

FIG. 7 shows a schematic cross section through a first mounting arrangement of the semiconductor chips 12 and 13 in the mounting position 11. To this end the interconnection film 9 comprises an access opening 19 in the mounting position 11, which is covered by the optical semiconductor chip 12 and through which the semiconductor chip 12 arranged on the optical axis 10 receives optical signals from an optical waveguide (not shown) or sends them to an optical waveguide (not shown). The application-specific semiconductor chip 13 is mounted on the rear side of the optical semiconductor chip 12, and is electrically connected via bonding wires 17 and contact terminal surfaces 29 to the interconnections 37 of the interconnection film 9.

FIG. 8 shows a schematic cross section through a second mounting arrangement of the semiconductor chips 12 and 13 in the mounting position 11. The interconnection film 9 does not comprise an access opening in this case, as it does in FIG. 7, rather the optical chip 12 is arranged on the inside in the direction of the optical waveguide (not shown) and connected via bonding wires 17 to contact terminal surfaces 29 of the interconnection film 9, the contact terminal surfaces 29 for the semiconductor chip 12 being connected by via contacts 30 through the interconnection film 9 to corresponding interconnections 37 of the interconnection film 9. The application-specific semiconductor chip 13, which is in turn electrically connected to the interconnection film 9 via bonding wires 17, is arranged on the opposite side, away from the optical waveguide (not shown).

FIG. 9 shows a schematic cross section through a third mounting arrangement of the semiconductor chips 12 and 13 in the mounting position, the two semiconductor chips 12 and 13 again being arranged on different surfaces of the interconnection film 9, with the difference that the application-specific semiconductor chip 13 is in this case electrically connected to contact terminal surfaces 29 of the interconnection film 9 via flipchip contacts 18.

FIG. 10 shows a schematic cross section along a vertical section plane through an optocoupler 3 according to a third embodiment. Components which have the same functions as in FIG. 1 are denoted by the same references and not explained again. The difference of the third embodiment from the first embodiment, as shown in FIG. 1, includes the mounting arrangement of the semiconductor chips 12 and 13 on the mounting position 11 of the interconnection film 9. Both semiconductor chips 12 and 13 are electrically connected to corresponding contact terminal surfaces 29 of the interconnection film 9 via bonding wires 17, an advantage here being that it is not necessary to provide an access opening in the film. For assembly, the application-specific semiconductor chip is mounted via the cavity 32, and the optical semiconductor chip 12 is introduced via the cavity 39 intended for the jack connector 5.

FIG. 11 shows a schematic cross section along a vertical section plane through an optocoupler 40 according to a fourth embodiment, components which have the same functions as in FIG. 1 being denoted by the same references and not explained again. The difference from the previous embodiments again resides in the mounting arrangement of the semiconductor chips 12 and 13 on the mounting position 111 of the interconnection film 9, this time the application-specific semiconductor chip 13 being mounted on contact terminal surfaces 29 of the interconnection film 9 with the aid of flipchip contacts 18.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An optocoupler for converting optical signals into electrical signals and vice versa, the optocoupler comprising:
   a package including:
      a jack connector for receiving an optical waveguide; and
      a flexible interconnection film;
   surface-mountable outer contacts arranged, outside the package, on a portion of the flexible interconnection film disposed on a lower side of the package;
   semiconductor chips, including an optical semiconductor chip and an application-specific semiconductor chip with an integrated circuit, the semiconductor chips being disposed inside the package; and
   a mounting position for the semiconductor chips, the mounting position being arranged in the package on an optical axis of the optical waveguide, the optical semiconductor chip being aligned with the optical axis, wherein the optical semiconductor chip is mounted, in the region of the optical axis and in the direction of the optical waveguide, on an upper side of the flexible interconnection film, and the application-specific semiconductor chip is mounted on an opposite lower side of the flexible interconnection film;
   wherein the interconnection film comprises, between the mounting position and the outer contacts, a curved region embedded in the package such that the surface-mountable outer contacts on the lower side of the package are freely accessible.

2. The optocoupler as claimed in claim 1, wherein at least one of the semiconductor chips is electrically connected to the interconnection film via bonding wires.

3. The optocoupler as claimed in claim 1, wherein at least one of the semiconductor chip comprises flipchip contacts via which the at least one of the semiconductor chips is electrically connected to the interconnection film.

4. The optocoupler as claimed in claim 1, further comprising:
   a connection sleeve for enclosing an end of the optical waveguide,
   wherein the jack connector comprises a conical sleeve receptor adapted to receive the connection sleeve, thereby providing the end of the optical waveguide with an accurate fit.

5. The optocoupler as claimed in claim 4, wherein the package further comprises latching hooks for anchoring the connection sleeve.

6. The optocoupler as claimed in claim 5, further comprising:
   an optical waveguide with an end enclosed in the connection sleeve, wherein the connection sleeve is anchored by the latching hooks.

7. The optocoupler as claimed in claim 1, wherein the package further comprises a plastic package compound encapsulating at least a portion of the flexible interconnection film and the jack connector.

8. The optocoupler as claimed in claim 1, wherein the package further comprises a plastic package compound including electrically conductive particles as filler material.

9. The optocoupler as claimed in claim 1, wherein the package further comprises a plastic package compound including graphite particles as filler material.

10. A mobile telephone, comprising the optocoupler as claimed in claim 1.

11. A digital camera, comprising the optocoupler as claimed in claim 1.

12. A camcorder, comprising the optocoupler as claimed in claim 1.

13. An optocoupler for converting optical signals into electrical signals and vice versa, the optocoupler comprising:
   a package including:
      a jack connector for receiving an optical waveguide; and
      a flexible interconnection film;
   surface-mountable outer contacts arranged, outside the package, on a portion of the flexible interconnection film disposed on a lower side of the package;
   semiconductor chips, including an optical semiconductor chip and an application-specific semiconductor chip with an integrated circuit, the semiconductor chips being disposed inside the package;
   a mounting position for the semiconductor chips, the mounting position being arranged in the package on an optical axis of the optical waveguide, the optical semiconductor chip being aligned with the optical axis,
   wherein the interconnection film comprises, between the mounting position and the outer contacts, a curved region embedded in the package such that the surface-mountable outer contacts on the lower side of the package are freely accessible; and
   a metal layer masking at least one surface of the interconnection film separated by the curved region;
   wherein the flexible interconnection film comprises at least one interconnection arranged through the film such that a ground potential can be applied to the metal layer via an outer contact.

14. The optocoupler as claimed in claim 13, further comprising:
   a semiconductor chip stack including the optical and application-specific semiconductor chips;
   wherein the interconnection film further comprises an access opening in the region of the optical axis of the package, behind which the semiconductor chip stack is mounted.

15. The optocoupler as claimed in claim 14, wherein the semiconductor chip stack further comprises flipchip contacts, wherein the stack is fixed, via the flipchip contacts, to the interconnection film in an edge region of the access opening.

16. The optocoupler as claimed in claim 13, wherein at least one of the semiconductor chips is electrically connected to the interconnection film via bonding wires.

17. The optocoupler as claimed in claim 13, wherein at least one of the semiconductor chip comprises flipchip contacts via which the at least one of the semiconductor chips is electrically connected to the interconnection film.

18. An optocoupler for converting optical signals into electrical signals and vice versa, the optocoupler comprising:
   a package including:
      a jack connector for receiving an optical waveguide;
      a flexible interconnection film; and
      a plastic package compound encapsulating at least a portion of the flexible interconnection film and the jack connector;
   surface-mountable outer contacts arranged, outside the package, on a portion of the flexible interconnection film disposed on a lower side of the package;
   semiconductor chips, including an optical semiconductor chip and an application-specific semiconductor chip with an integrated circuit, the semiconductor chips being disposed inside the package; and
   a mounting position for the semiconductor chips, the mounting position being arranged in the package on an optical axis of the optical waveguide, the optical semiconductor chip being aligned with the optical axis;
   wherein the interconnection film comprises, between the mounting position and the outer contacts, a curved region fully embedded in the plastic package compound such that the surface-mountable outer contacts on the lower side of the package are freely accessible.

* * * * *